United States Patent [19]

Suwald

[11] Patent Number: 5,473,652
[45] Date of Patent: Dec. 5, 1995

[54] COUNTER AND/OR DIVIDER ARRANGEMENT

[75] Inventor: Thomas Suwald, Hamburg, Germany

[73] Assignee: U.S. Philips Corporation, New York, N.Y.

[21] Appl. No.: 215,443

[22] Filed: Mar. 18, 1994

[30] Foreign Application Priority Data

Mar. 20, 1993 [DE] Germany .................. 43 08 979.8

[51] Int. Cl.$^6$ ................................. G01R 23/02
[52] U.S. Cl. ........................................... 377/47
[58] Field of Search ................................ 377/47

[56] References Cited

U.S. PATENT DOCUMENTS

| 4,866,740 | 9/1989 | Iijima | 377/47 |
| 5,195,111 | 3/1993 | Adachi et al. | 377/47 |

FOREIGN PATENT DOCUMENTS

4214612 of 0000 Germany.

*Primary Examiner*—Margaret Rose Wambach
*Attorney, Agent, or Firm*—David Schreiber

[57] ABSTRACT

A counter and/or divider arrangement, comprising at least two subsidiary counter circuits, each of which comprises a number of flipflops which are concatenated in respect of their data inputs and outputs, all subsidiary counter circuits receiving a common clock signal, and also comprising at least one logic element, enables the implementation of arbitrary counting operations or division ratios with a low expenditure as regards circuitry and with low-noise operation in that in each logic element signals from the data output of one of the flipflops of at least a part of the subsidiary counter circuits are combined in conformity with an AND-function so as to form an associated resultant signal, each of the resultant signals being applied to at least one of the subsidiary counter circuits as a reset signal in order to switch the subsidiary circuit to an initial state, an output signal being formed from at least one of the resultant signals, the product of the total numbers of flipflops of all subsidiary counter circuits being larger than or equal to a predetermined maximum count or division ratio, the total numbers being determined so that they do not exhibit common prime factors, the data outputs of the flipflops connected to the logic elements of the subsidiary counter circuits being selected so that the output signal exhibits the predetermined maximum count or division ratio.

18 Claims, 4 Drawing Sheets

COUNTER AND/OR DIVIDER ARRANGEMENT

BACKGROUND OF THE INVENTION

The invention relates to a counter and/or divider arrangement, comprising at least two subsidiary counter circuits, each of which comprises a total number of flipflops which are concatenated in respect of their dam inputs and outputs, all subsidiary counter circuits receiving a common clock signal, and also comprising at least one logic element.

German Patent Application P 42 14 612.7 describes an arrangement comprising three frequency divider circuits whose clock inputs are connected together to a terminal carrying a clock signal whose frequency is to be divided. Each of the frequency divider circuits comprises a concatenation of flipflops. An output of the respective last flipflop of each concatenation is connected to a respective input of an AND-gate. From the signals on the outputs of the flipflops, the AND-gate forms a frequency-divided output signal by performing an AND-function, which output signal is determined according to the principle of the smallest common multiples of the division ratios of the individual frequency divider circuits. The resultant division ratio thus stems from the product of the division ratios of the individual frequency divider circuits. The division ratios of the individual frequency divider circuits should not exhibit common prime factors.

In the arrangement described in German Patent Application P 42 14 612.7 suitable interference suppression is achieved because of the construction of the individual frequency divider circuits in which only a few, mutually compensating switching operations take place simultaneously, or in which always at least, substantially the same number of switching operations take place. However, the division ratios that can be achieved in such an arrangement are limited to values which can be formed by the smallest common multiples of the division ratios of the individual frequency divider circuits. For the implementation of frequency division ratios which correspond to large prime numbers or contain such large prime numbers, the described arrangement cannot be used, or leads to unacceptable expenditures.

It is an object of the invention to construct a counter and/or divider arrangement of the kind set forth so that arbitrary counting operations or division ratios can be achieved while maintaining a construction which produces very little switching interference and without excessive expenditures.

In a counter and/or divider arrangement of the kind set forth this object is achieved in that in each logic element signals from the data output of one of the flipflops of at least a part of the subsidiary counter circuits are combined according to an AND-function so as to form an associated resultant signal, each of the resultant signals being applied as a reset signal to at least one of the subsidiary counter circuits in order to adjust the subsidiary counter circuit to an initial state, from at least one of the resultant signals there being formed an output signal, the product of the total numbers of the flipflops of all subsidiary counter circuits being chosen to be greater than or equal to a predetermined maximum count or division ratio, the total numbers being determined so that they do not exhibit common prime factors, the data outputs of the flipflops of the subsidiary counter circuits which are connected to the logic elements being chosen so that the output signal exhibits the predetermined maximum count or division ratio.

SUMMARY OF THE INVENTION

The counter and/or divider arrangement in accordance with the invention combines the advantages of the frequency divider circuit disclosed in German Patent Application P 42 14 612.7 and the advantage of a maximum count or division ratio that can be chosen at random. Thus, periodic clock signals can thus be transformed into an output signal whose frequency has been divided by an arbitrary, integer ratio and, for example counting pulses of a non-periodic clock signal can be counted up to a maximum count which can be chosen at random. Because of the construction of the individual subsidiary counter circuits, very thorough suppression of interference of the frequency of the sub-harmonics of the clock signal is achieved during operation of the counter and/or divider arrangement in accordance with the invention; moreover, interference of clock frequency is also reduced. The peak current consumption of the counter and/or divider arrangement is also substantially reduced; this has a favourable effect also on the proportioning of the power supply required. The unlimited choice of the maximum count or division ratio, in comparison with the counting method described in German Patent Application P 42 14 612.7, is made possible in accordance with the invention in that at least two subsidiary counter circuits are used with mutually different moduli which are influenced always in dependence on the instantaneous count of the individual subsidiary counter circuits. Such influencing is achieved in that one subsidiary counter circuit is reset in response to a given own count as well as in response to predetermined counts of the other subsidiary counter circuits, corresponding to a reduction of its period duration. The maximum count or division ratio to be achieved can be formed by selection of this reduction of the period duration.

A first further embodiment of the counter and/or divider arrangement in accordance with the invention, comprising two subsidiary counter circuits as well as two logic elements, each of which comprises two inputs, is characterized in that the inputs of each logic element are connected to a respective data output of one of the flipflops of a respective one of the subsidiary counter circuits, the resultant signal of each of the logic elements being applied as a reset signal to a respective one of the subsidiary counter circuits.

In another embodiment of the counter and/or divider arrangement in accordance with the invention, at least two subsidiary counter circuits and one logic element are coupled to one another so that the data output of one of the flipflops of each subsidiary counter circuit is connected to a respective input of the logic element, the resultant signal of the logic element being applied as a common reset signal to all subsidiary counter circuits.

Thus, in said first embodiment of the counter and/or divider arrangement in accordance with the invention each time one of the subsidiary counter circuits is reset to its initial state at a given combination of counts of these circuits. The desired maximum count or division ratio is thus subdivided into two segments whose lengths are decisive in respect of the choice of the data outputs of the flipflops to be connected to the inputs of the logic elements. The length of each of these segments is subdivided, in conformity with the choice of the flipflops whose data outputs are connected to the respective logic element, into a number of passes through a subsidiary counter circuit and some additional counting steps until the logic element is driven via said data output of the flipflop. The selection of the flipflop whose data outputs are connected to the logic elements thus offers an adequate number of degrees of freedom to enable representation of any desired maximum count or division ratio.

In said other embodiment of the counter and/or divider arrangement in accordance with the invention, comprising at least two subsidiary counter circuits and only one logic element, the simplified construction is accompanied by a reduction of the degrees of freedom in respect of proportioning, but the remaining degrees of freedom still suffice to achieve an arbitrary maximum count or division ratio. The desired maximum count (or division ratio) is then represented by a number of counting passes through one of the subsidiary counter circuits plus a correspondingly chosen number of individual counting steps. In order to identify the passes of said subsidiary counter circuit which are to be absolved completely with respect to the pass during which the data output of the selected flipflop of the subsidiary circuit which is connected to the logic element is to trigger the common reset signal, the counts reached by the other subsidiary counter circuits at this count of said subsidiary counter circuit are also evaluated in the logic element.

In a further version of the invention, the arrangement comprises at least one further logic element, a respective input of which is connected to the data output of a respective flipflop of each subsidiary counter circuit, as well as a selection device which receives all resultant signals and which applies one resultant signal therefrom as a common reset signal to all subsidiary counter circuits.

Using such an arrangement, several different maximum counts or division ratios can simply be obtained, it also being possible to switch over between these individual maximum counts or division ratios. A switchable counter and/or divider arrangement can thus be simply constructed.

The embodiment of the counter and/or divider arrangement according to the invention which comprises at least two subsidiary counter circuits and one logic element is preferably proportioned in conformity with the following relation which holds for each of the subsidiary counter circuits:

$$qi=((n-1) \bmod (li))+1,$$

where i denotes the subsidiary counter circuit, n denotes the maximum count or division ratio, li denotes the total number of flipflops of the $i^{th}$ subsidiary counter circuit, qi denotes the serial number of the flipflop in the concatenation of the $i^{th}$ subsidiary counter circuit whose data output is connected to the logic element, and mod denotes the modulo function.

This relation implies that the total numbers of flipflops of the individual subsidiary counter circuits have already been defined for a predetermined maximum count or subsidiary ratio, i.e. that the length of these subsidiary counter circuits has been determined. The modulo function determines the remainder of an integer division. The determination of the flipflops whose dam outputs are connected to the logic element is thus based directly on the knowledge of the total numbers of flipflops of the subsidiary counter circuits which can be determined, in conformity with a further version of the invention, approximately in conformity with the relation $$li=int((n/(l1 \cdot l2 \cdot \ldots \cdot lj))^{1/(t-j)}),$$

starting with $$l1=int((n)^{1/t}),$$

where j=i−1, t is the number of subsidiary counter circuits, and int denotes the function for rounding to the next-lower integer number, the values thus determined for the total numbers (li) being modified, if necessary, so that they do not have common prime factors, the product of all total numbers (li) of flipflops of the subsidiary counter circuits being larger than or equal to the maximum count or division ratio (n).

In conformity with the above relations, the subsidiary counter circuits can be designed in two steps in respect of the total numbers of flipflops and the data outputs selected for connection to the logic element when the desired maximum count or division ratio is given and, moreover, the number of subsidiary counter circuits is selected. The maximum count or division ratio is then defined first of all by the intended application of the counter and/or divider arrangement to be constructed in accordance with the invention. However, the number of subsidiary counter circuits can be chosen to be different for a predetermined maximum count or division ratio. This choice can advantageously be made so that the overall required circuitry, or the circuitry required especially for the subsidiary counter circuits, is minimized. In order to estimate the required circuitry, in a further embodiment of the invention the minimum number (k) of all flipflops required in the subsidiary counter circuits can be determined approximately from the (predetermined) maximum count or division ratio (n) in conformity with:

$$k=int(t \cdot (n)^{1/t})+1.$$

In this relation, the minimum number of flipflops is a function of the number of subsidiary counter circuits and the maximum count or division ratio. From this function a minimum value can be determined for the minimum number of all flipflops and on the basis thereof a minimum can be determined for the overall expenditure for the counter and/or divider arrangement in accordance with the invention in dependence on the number of subsidiary counter circuits. This minimum, or the associated number of subsidiary counter circuits, is used for the proportioning of the individual subsidiary counter circuits. It is to be noted that the number of all flipflops of the subsidiary counter circuits which is actually obtained results from the sum of the total numbers of the flipflops of the individual subsidiary counter circuits and that the above relation is merely an approximative formula for estimating the proportions. Moreover, for the determination of the overall circuit requirements the logic elements also have to be taken into account.

Preferably, a counter and/or divider arrangement in accordance with the invention is constructed so that at least one of the subsidiary counter circuits comprises a logic circuit for forming a signal for influencing an input signal, applied to a first flipflop in the concatenation of flipflops of at least one of the subsidiary counter circuits, in dependence on signals on given data outputs of the flipflops of the subsidiary counter circuit comprising the relevant logic circuit. Such logic circuits have already been disclosed in German Patent Application P 42 14 612.7 and serve for error correction, notably upon putting into operation of the counter and/or divider arrangement, but also for the compensation of disturbances during operation.

The counter and/or divider arrangements in accordance with the invention are preferably constructed so that the subsidiary counter circuits have a modular construction with corresponding concatenations of flipflops and corresponding logic circuits as well as for each subsidiary counter circuit a reset collecting line and at least one output collecting line, each output collecting line being selectably connectable to one of the data outputs of the flipflops in order to apply the signal on this data output to the associated logic element, and the reset collecting line being selectably connectable to reset inputs of one or more flipflops and also being coupled to a data input of the first flipflop in the concatenation of flipflops and additionally different, selected signals can be selectably applied to the logic circuit from the data outputs of the flipflops.

Such a modular construction is advantageous notably when a circuit arrangement having a predetermined basic construction should be adaptable as simply as possible to different applications. This is the case, for example when it is used in customer specific integrated circuits. For a variety of applications the uniform basic construction can then be derived from a so-called library, and can be adapted to the desired application preferably by means of a single, customer-specific so-called wiring mask which establishes the electrical connections between the uniformly provided circuit elements of the basic construction as imposed by the special requirements of the relevant desired application. In the counter and/or divider arrangement in accordance with the invention, for example the total number of flipflops in the concatenation of a subsidiary counter circuit can be determined by such a wiring mask and, moreover, the configuration of the logic circuit, notably the number of active input terminals of this logic circuit, the serial number of the flipflop or flipflops in the concatenation of the relevant subsidiary counter circuit, its data output or their data outputs connected to the logic element, as well as possibly also the configuration of the logic element itself can be selected thereby. Thus, the modular construction can involve either only the concatenation of the flipflops as well as the associated logic circuit, but also, for example the logic element or the logic elements.

A counter and/or divider arrangement in accordance with the invention is preferably used in a sequencer. The invention is particularly suitable for the construction of low-noise and economical sequencers which are also suitable for high speed applications. The advantage of the counter and/or divider arrangement in accordance with the invention resides in the ease of decoding of individual counts by simple logic combination of a respective selected data output of each subsidiary counter circuit. In comparison with customary sequencers, comprising a binary counter and a decoder, the increased expenditure in respect of flipflops, in comparison with the binary counter, is already compensated for by the strongly simplified decoder even when only few counts are to be decoded. Moreover, sequencers constructed in accordance with the invention can dispense with so-called pipelining in the event of high-speed applications. For example, a modulo-598 counter with a binary counter and a customary decoder requires approximately 150 gates for the decoding of four counts, whereas for the same application a sequencer in accordance with the invention requires only 82 gates. An additional advantage consists in that considerably less pulse interference is generated.

BRIEF DESCRIPTION OF THE DRAWINGS

Some embodiments of the invention will be described in detail hereinafter with reference to the drawing. Therein.

DETAILED DESCRIPTION OF THE PREFERRED EMBODIMENTS

Figure 1:
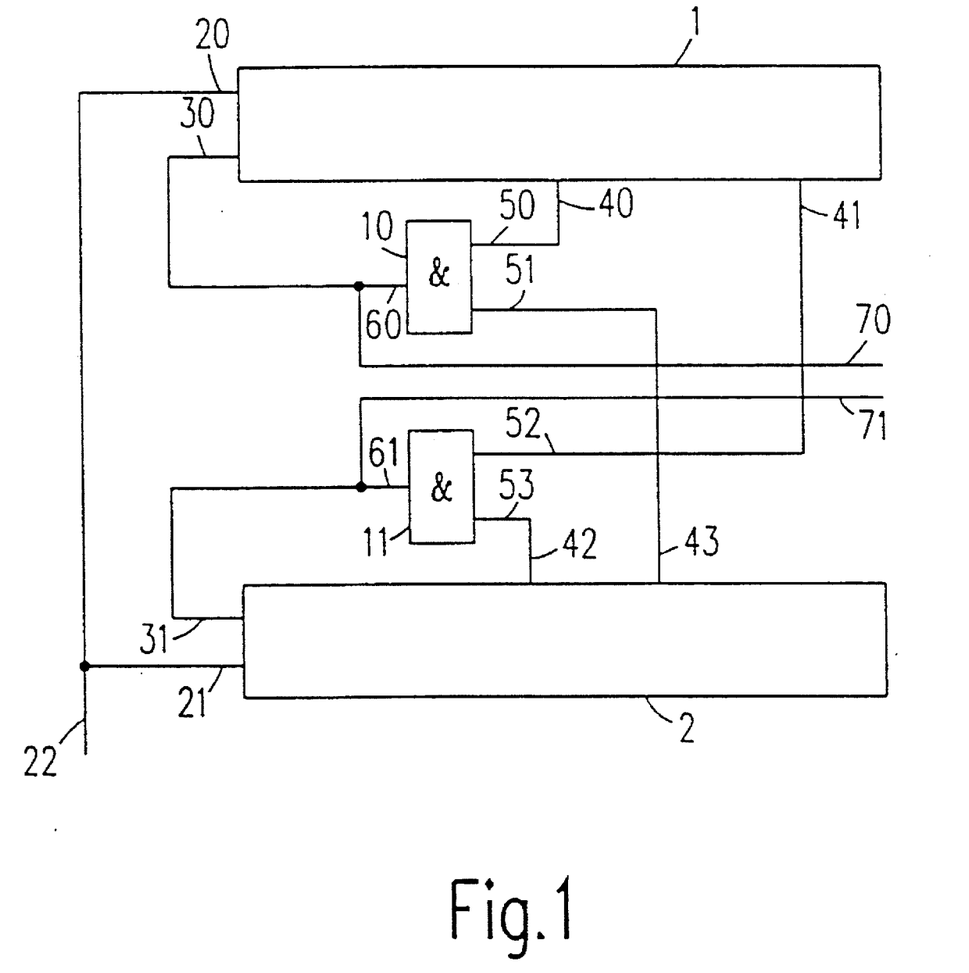
FIG. 1 shows an embodiment of a counter and/or divider arrangement comprising two subsidiary counter circuits and two logic elements.

FIG. 1 shows a first embodiment of the invention in the form of a counter and/or divider arrangement, comprising two subsidiary counter circuits 1, 2 as well as two logic elements 10, 11 which are formed as AND-gates. Each of the subsidiary counter circuits 1, 2 comprises an input 20, 21 for the clock signal; both inputs 20, 21 receive a common clock signal from a common clock signal terminal 22. The common clock signal serves as an input signal whose frequency is to be divided by a predetermined division ratio or in which the pulses, signal edges or the like are to be counted a predetermined maximum count. This clock signal may be periodic but also non-periodic.

Each of the subsidiary counter circuits 1, 2 also comprises a reset input 30, 31 for receiving a reset signal whereby the relevant subsidiary counter circuit can be set to an initial state which preferably corresponds to a count zero of the subsidiary counter circuit.

Each of the subsidiary counter circuits 1, 2 shown in FIG. 1 comprises a given total number of flipflops which are concatenated in respect of their data inputs and outputs. The data outputs of two selected flipflops of each subsidiary counter circuit 1, 2 form two control outputs 40, 41 and 42, 4B per respective counter circuit 1, 2. The first control output 40 of the first subsidiary counter circuit 1 is connected to a first input 50 of the first logic element 10, the second control output 41 of the first subsidiary counter circuit 1 being connected to a first input 52 of the second logic element 11, whereas the first control output 42 of the second subsidiary counter circuit 2 is connected to a second input 53 of the second logic element 11 and the second control output 43 of the second subsidiary counter circuit 2 is connected to a second input 51 of the first logic element 10. An output 60 of the first logic element 10 is connected to the reset input 30 of the first subsidiary counter circuit 1, an output 61 of the second logic element 11 being connected to the reset input 31 of the second subsidiary counter circuit 2. Moreover, two output terminals 70, 71 are connected to the outputs 60 and 61 of the logic elements 10 and 11, respectively, said output terminals supplying output signals whose frequency has been divided, relative to the clock signal on the clock signal terminal 22 which constitutes the input signal, in conformity with the predetermined maximum count or division ratio of the circuit arrangement of FIG. 1. In conformity with the different control outputs 40, 43 and 41, 42 of the subsidiary counter circuits 1 and 2, respectively, combined by the logic elements 10, 11, pulses occur at mutually offset instants in the frequency-divided output signals on the output terminals 70 and 71.

In the circuit arrangement shown in FIG. 1 both subsidiary counter circuits 1, 2 are clocked in synchronism by the common clock signal supplied via the clock signal terminal 22. In the concatenation of flipflops of each of the subsidiary counter circuits 1, 2 a pulse having the length of one period duration of the clock signal then circulates cyclically as disclosed in detail in German Patent Application P 42 14 612.7, so that both subsidiary counter circuits 1, 2 count cyclically in conformity with the total number of the flipflops included in their concatenations. The subsidiary counter circuits thus operate preferably with non-inverting feedback.

In conformity with the arrangement of the control outputs 40, 41 and 42, 43, in predetermined periods of the clock signal signals appear thereon from the corresponding data outputs of the flipflops, which signals will be referred to hereinafter as control signals. These control signals are combined in the logic elements 10 and 11 so as to form resultant signals on the outputs 60 and 61, respectively. The resultant signal on the output 60 of the first logic element 10 is applied as a reset signal to the reset input 30 of the first subsidiary counter circuit 1, whereas the resultant signal on the output 61 of the second logic element 11 is applied to the reset input 31 of the second subsidiary counter circuit 2. The reset signals adjust the subsidiary counter circuits 1, 2 to the same initial state which they reach after circulation of the pulse through all flipflops of the concatenation, i.e. after a counting cycle or modulus. Thus, when the control signal from the second control output 43 of the second subsidiary counter circuit 2 has enabled, via the second input 51 of the first logic element 10, the signal path from the first control output 40 of the first subsidiary counter circuit 1 to its reset input 30, the first subsidiary counter circuit 1 can already be reset to the initial state from the count determined by the flipflop connected to this first control output 40. The first control output 40 thus corresponds to a shortened modulus of the first subsidiary counter circuit 1. The same holds for the first control output 42 of the second subsidiary counter circuit 2. The second control outputs 41 and 43 of the subsidiary counter circuits 1 and 2, respectively, determine when, i.e. in which counting period, the shortened modulus of the relevant other subsidiary counter circuit 2 or 1 is activated.

For the proportioning of such a counter and/or divider arrangement first the serial number Qa of the flipflop whose data output is connected to the first control output 40 of the first subsidiary counter device 1 is determined, as well as the serial number Qc of the flipflop of the second subsidiary counter circuit 2 whose data output is connected to the first control output 42, said serial numbers being determined from a predetermined maximum count or division ratio n and the predetermined total numbers 1a and 1b of the subsidiary counter circuits 1 and 2, respectively, in conformity with the following relations:

$$Qa=((n-1)\mod(la))+1,$$

$$Qc=((n-1)\mod(lb))+1.$$

Therein, the total numbers 1a, 1b of the subsidiary counter circuits 1, 2 have been chosen so that they do not have common prime factors and that their product is at least equal to the maximum count or division ratio n. Qa and Qc determine the shortened moduli of the subsidiary counter circuits 1, 2.

During the next step the serial number Qb of the flipflop of the first subsidiary counter circuit 1, whose data output is connected to the second control output 41, can be selected. From the quantities thus determined the serial number Qd of the flipflop whose data output is connected to the second control output 43 of the second subsidiary counter circuit 2 can be calculated in conformity with:

$$Qd=((Qc-(Qb-Qa)-1)\mod(Qc))+1.$$

In an example of proportioning the following values are obtained:

n=7, 1a=4, 1b=5,

Qa=3, Qb =1, Qc=2, Qd=2.

Figure 2:
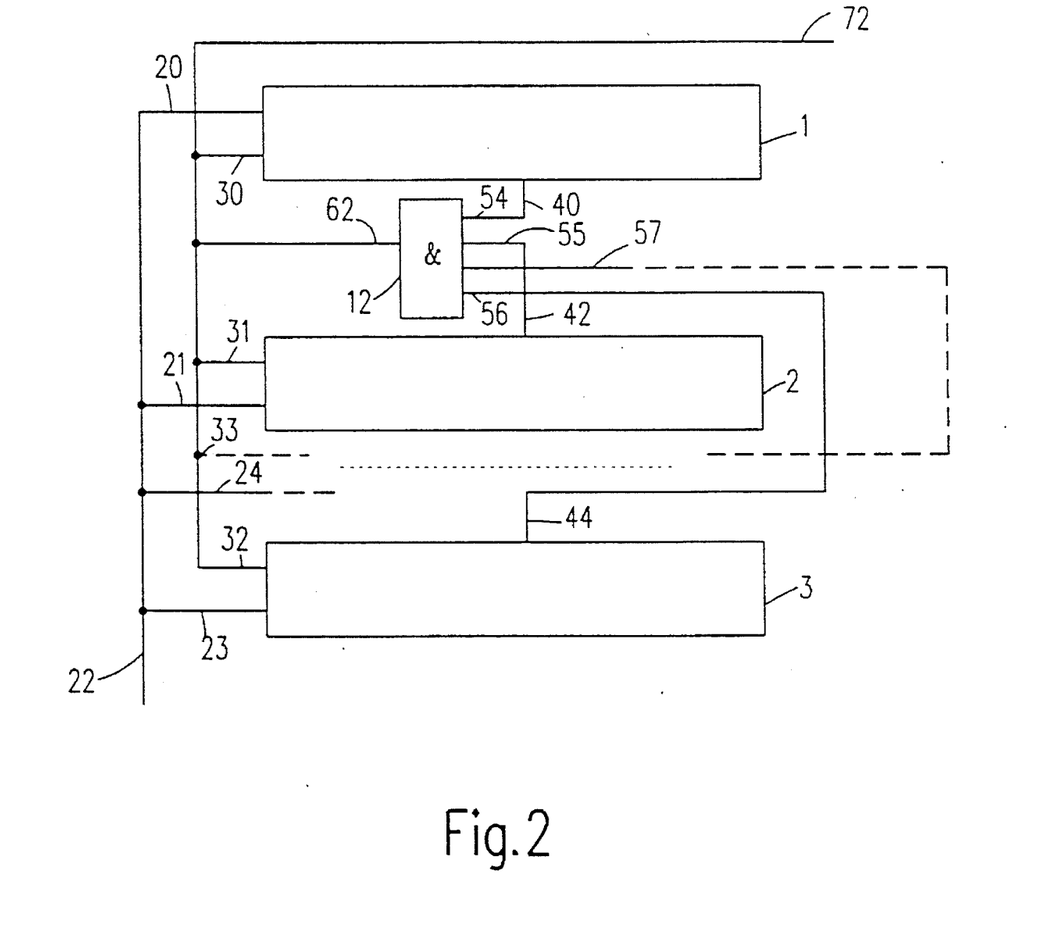
FIG. 2 shows a further embodiment comprising one logic element and three or more subsidiary counter circuits.

FIG. 2 shows a further embodiment of a counter and/or divider arrangement in accordance with the invention which is based on a simplification of the teaching of the invention. This counter and/or divider arrangement, in which the already described elements are denoted by the same references, comprises three subsidiary counter circuits 1, 2, 3 as well as one logic element 12 which is again constructed as an AND-gate and which comprises an input 54, 55 and 56 for each of the subsidiary counter circuits 1, 2, 3 respectively. In the embodiment shown in FIG. 2, each time only the first control output 40, 42 is fed out from the subsidiary counter circuits 1, 2 so as to be connected to the inputs 54 and 55, respectively, of the logic element 12. For the subsidiary counter circuits 1, 2 the inputs 20, 21 for the clock signal and the reset inputs 30, 31 for the reset signal are the same as in FIG. 1. Analogously, the third subsidiary counter circuit 3 comprises an input 23 for the clock signal, a reset input 32 for the reset signal, and a first control output 44 for the control signal extracted therefrom. Furthermore, dashed lines indicate that the counter and/or divider arrangement of FIG. 2 can be supplemented by further subsidiary counter circuits. For example, an input 24 of a further subsidiary counter circuit can be connected to the clock signal terminal 22 and a reset input 33 of this further subsidiary counter circuit can be connected to the reset inputs 30, 31, 32 of the previously mentioned subsidiary counter circuits; a corresponding control output of this further subsidiary counter circuit (not shown) can be connected to the input 57 of the logic element 12. Analogously, further subsidiary counter circuits can be added via further taps of the clock signal terminal 22, or via branches of the connection of the reset inputs 30, 31, 32, 33 as well as via additional inputs of the logic element 12 to be formed. The further description, however, is based on an embodiment which comprises three subsidiary counter circuits 1, 2, 3. The connection of the reset inputs 30, 31, 32, of the subsidiary counter circuits 1, 2, 3 is connected to an output 62 of the logic element 12. As a result, the resultant signal formed by the logic element 12 is applied as a common reset signal to all subsidiary counter circuits 1, 2, 3. The generating and use of only a single resultant signal as a common reset signal constitutes the simplification of the teaching of the invention as explained with reference to the embodiment of FIG. 2.

For use as a divider arrangement, the embodiment shown in FIG. 2 comprises an output terminal 72 which is connected to the output 62 of the logic element 12 and supplies the resultant signal available thereon as an output signal whose frequency has been divided in comparison with the clock signal applied to the clock signal terminal 22.

For a predetermined maximum count or division ratio n to be realised, for the proportioning of the circuitry first the number t of subsidiary counter circuits is determined. This number t should be chosen so that the overall expenditure for the counter and/or divider arrangement is minimized. The minimum number k of all flipflops required in the subsidiary counter circuits 1, 2, 3 etc. can be used as an approximative measure of the overall expenditure, which minimum number can be determined approximately in conformity with the relation:

$$k=int(t\cdot(n)^{1/t})+1.$$

The minimum number k of flipflops required as a function of the number t of subsidiary counter circuits exhibits a minimum value and the associated value for the number t can be used as a start for the design of the circuit. It is to be noted that the expenditure for the logic element 12 increases as the number t of subsidiary counter circuits increases.

During the next step of circuit proportioning the total numbers li of flipflops of the subsidiary counter circuits are individually determined. The total number l1 of the first subsidiary counter circuit 1 is then obtained in conformity with the formula:

$$l1=int((n)^{1/t}),$$

the total number l2 of the next (second) subsidiary counter circuit 2 thus being calculated as $$l2=int((n/l1)^{1/(t-1)}).$$

On the basis of the previously calculated total numbers l1, l2, ..., the total number li of the $i^{th}$ subsidiary counter circuit is calculated from the equation $$li=int((n/(l1,l2\cdot\ldots\cdot lj))^{1/(t-1)}).$$

Therein, j=i−1 and int is the function for rounding to the next-lower integer number.

During the last step, from the total numbers li of the flipflops of the individual subsidiary divider circuits 1, 2, 3, etc. there can be determined the serial number of the flipflop in the concatenation of the individual subsidiary counter circuit 1 or 2 or 3 ... whose data output is connected to the logic element, i.e. the assignment of the control output 40 or 42 or 44, respectively, can be determined. This serial number qi is determined as:

$$qi=((n-1)\bmod(li))+1,$$

where mood is the modulo function. All characteristic data for the construction of the counter and/or divider arrangement in accordance with the invention has thus been calculated for the desired maximum count or division ratio.

In an example of proportioning there is obtained:

n=73, where the minimum for the minimum number k of flipflops with k=12 is reached for t=4. Therefrom, after calculation in conformity with the previously described relations, there are obtained l1=2, l2=3, l3=3 and l4=4.

In order to avoid corresponding prime factors in the total numbers li and to satisfy the condition that the product of all li must be at least equal to the predetermined maximum count or division ratio n, therefrom there are selected:

l1=2, l2=3, l3=5, l4=7.

The actual number of flipflops then amounts to 17 and the serial numbers of the flipflops whose data outputs form the control outputs of the subsidiary counter circuits then are:

q1=1, q2=1, q3=3, q4=3.

Figure 3:
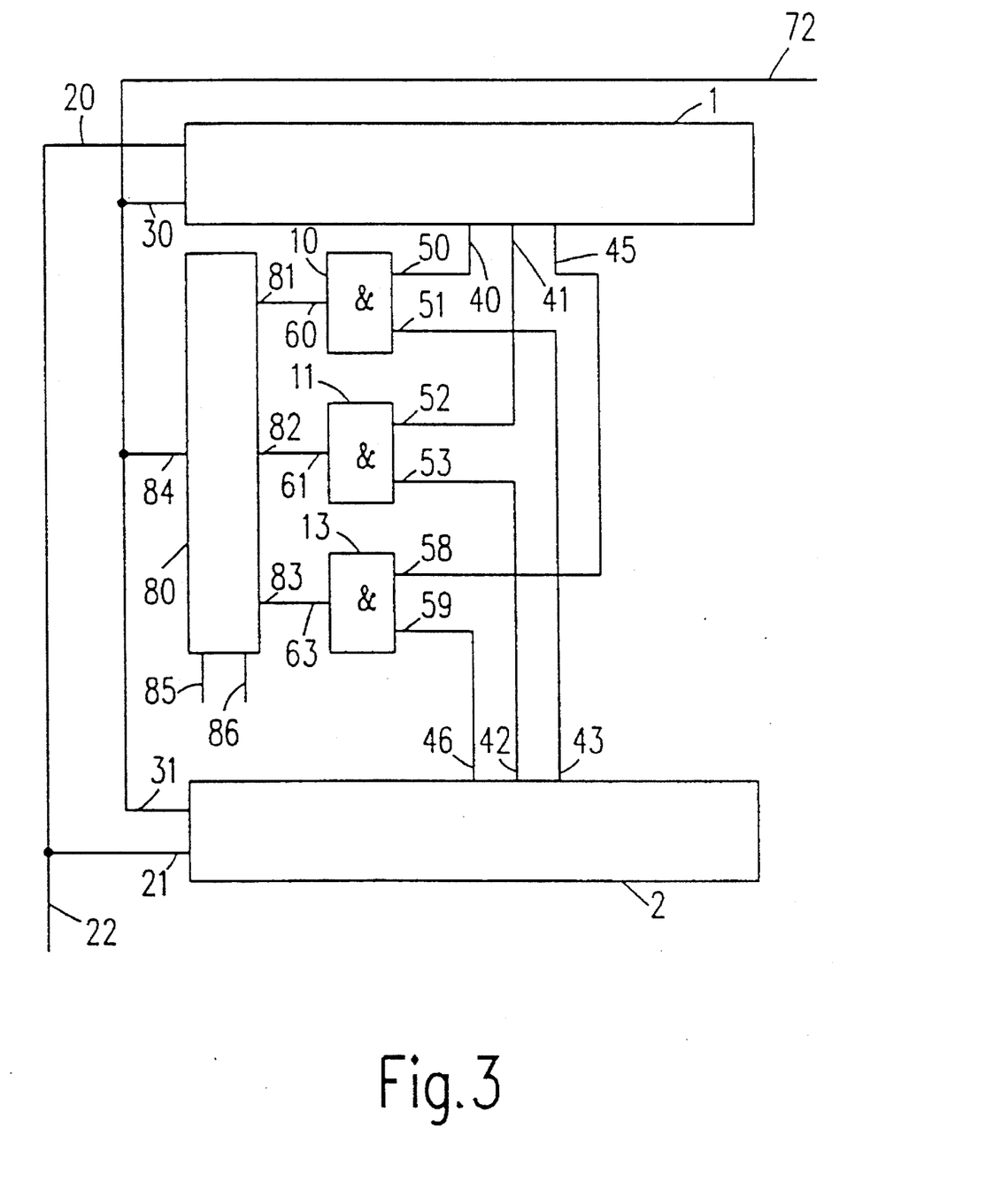
FIG. 3 shows an embodiment comprising two subsidiary counter circuits and several logic elements via which the subsidiary counter circuits can be selectably reset.

FIG. 3 shows a further embodiment of the counter and/or divider arrangement of FIG. 2 in which switching over between different maximum counts or division ratios is possible. To this end, the embodiment shown in FIG. 3 comprises two subsidiary counter circuits 1, 2 which correspond to the subsidiary counter circuits shown in FIG. 1, be it that they also comprise a respective third control output 45, 46. The otherwise corresponding features of the elements in FIG. 3 are again denoted by the reference numerals used in the preceding Figures.

The circuit arrangement of the embodiment shown in FIG. 3 comprises a third logic element 13 whose first input 58 is connected to the third control output 45 of the first subsidiary counter circuit 1 and whose second input 59 is connected to the third control output 46 of the second subsidiary counter circuit 2. The third logic element 13 is also constructed as an AND-gate. Its output 63 is connected to a third input 83 of a selection device 80 whose first input 81 is connected to the output 60 of the first logic element 10 and whose second input 82 is connected to the output 61 of the second logic element 11. An output 84 of the selection device 80 is connected to the interconnected reset inputs 30, 31 of the subsidiary counter circuits 1, 2 as well as to the output terminal 72 for the frequency-divided signal (output signal). Preferably, the selection device 80 is constructed as a multiplexer circuit whereby one of the inputs 81, 82, 83 can be selectably connected to the output 84. Thus, each time only one of the logic elements 10, 11 or 13 is active, and hence also only one of the maximum counts or division ratios defined by the wiring of these elements. The selection device 80 can be switched to the desired switching state by switching signals supplied via switching inputs 85, 86. The circuit arrangement shown in FIG. 3 thus corresponds to that shown in FIG. 2 which comprises only two subsidiary counter circuits. It would in principle also be possible to provide only a single logic element with two inputs and to supply these inputs with the signals from the control outputs 40, 41, 45 and 42, 43, 46 via a respective selection device. However, because the circuitry required for the selection devices is greater than that for the logic elements, the expenditure for the configuration shown in FIG. 3 is less.

Figure 4:
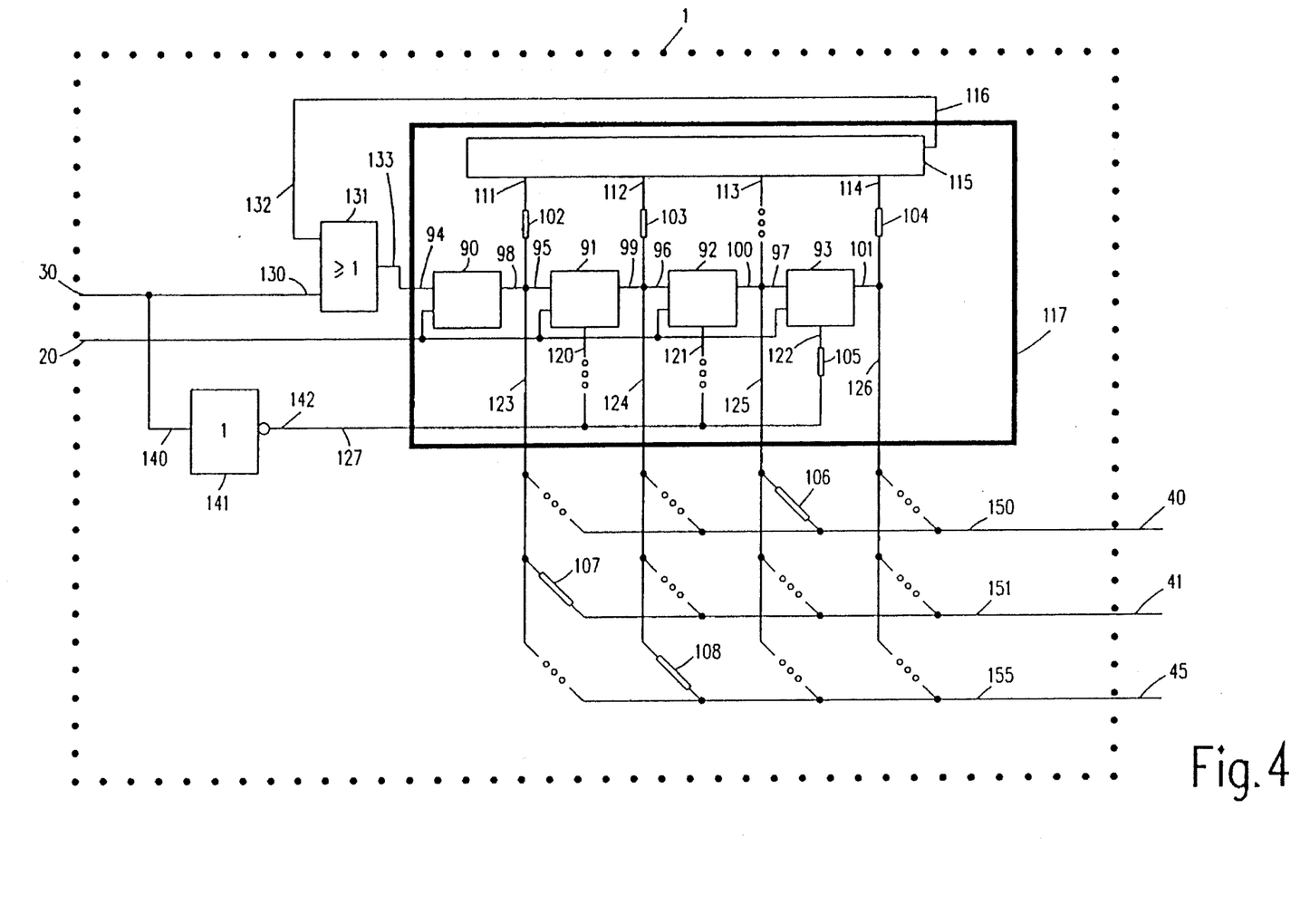
FIG. 4 shows an example of a modular construction of a subsidiary counter circuit.

FIG. 4 shows an embodiment of the construction of a subsidiary counter circuit which also serves as an example for the modular construction thereof. Therein, the first subsidiary counter circuit 1 of the FIGS. 1 to 3 is used by way of example, identical elements again being denoted by identical references.

The subsidiary counter circuit 1 of FIG. 4 comprises a total number l1 =4 of flipflops 90, 91, 92, 93 which are concatenated in respect of their data outputs 94, 95, 96, 97 and their data outputs 98, 99, 100, 101. The flipflops 90 to 93 are preferably D-type flipflops; their clock inputs are connected together to the input 20 for the clock signal. Inputs 111, 112, 113 and 114 of a logic circuit 115 can be connected to the junction of the data outputs 98, 99, 100 and the data inputs 95, 96, 97 as well as to the data output 101, via selectably settable connections (bridges) 102, 103 and 104. In the example shown, the connections 102, 103 and 104 to the first, the second and the fourth input 111, 112 and 114, respectively, of the logic circuit 115 are set; as a result, in the logic circuit 115 the signals from the data outputs 98, 99, 101 of the first, the second and the fourth flipflop 90, 91 and 93, respectively, are combined, whereas the signal from the data output 100 of the third flipflop 92 is not taken into account, because the third input 113 of the logic circuit 115 is not connected. As is described in detail in German Patent Application P 42 14 612.7, the connections 102, 103 and 104 can be set at different locations.

With the exception of the first flipflop 90 of the concatenation, all flipflops 91, 92, 93 comprise a respective reset input which, in conformity with the type of the flipflop used, can also be referred to as an enable input, because the signal applied to the flipflop via this input either resets the flipflop to an initial state or prevents further switching operations, depending on the type of flipflop. In FIG. 4 these reset inputs are denoted by the references 120, 121,122. Details in this respect are given in German Patent Application P 42 42

201.9. The latter Application also describes an example of the construction of the flipflops 90, 91, 92, 93 which is explicitly incorporated herein.

The reset inputs 120, 121, 122 in the circuit arrangement of FIG. 4 can be selectably connected to a reset collecting line 127 via which the flipflops 91 to 93 can receive a reset signal or an enable signal (depending on the type of flipflop) in order to adjust the subsidiary counter circuit to an initial state. In the embodiment shown in FIG. 4, merely the reset input 122 of the fourth flipflop 93 is connected to the reset collecting line 127, via a connection (bridge) 105, whereas the reset inputs 120, 121 of the second and the third flipflop 91, 92 are not connected.

From each of the data outputs 98 to 101 there is fed out a terminal 123, 124, 125, 126, respectively, wherefrom signals can be selectably applied to one or more control outputs 40, 41 or 45. The logic circuit 115 also comprises an output 116 which supplies a signal for influencing an input signal, applied to the data input 94 of the first flipflop 90, in dependence on the signals on the inputs 111 to 114.

The elements described thus far with reference to FIG. 4, combined in the drawing so as to form a group 117, are disclosed in principle in German Patent Application P 42 14 612.7. They can be grouped so as to form a subsidiary counter circuit module.

Such a subsidiary counter circuit module, however, can also comprise the following additional elements so that the structural simplifications can be achieved for the entire counter and/or divider arrangement. In the embodiment shown in FIG. 4, the reset input 30 of the subsidiary counter circuit 1 is connected on the one side to a first input 130 of an OR-gate 131 and on the other side to an input 140 of an inverter 141. A second input 132 of the OR-gate 131 is connected to the output 116 of the logic circuit 115, an output 133 of the OR-gate 131 being connected to the data input 94 of the first flipflop 90 and an output 142 of the inverter 141 being connected to the reset collecting line 127. As is described in German Patent Application P 42 14 612.7, the logic circuit 115 applies a signal, via the OR-gate 131, to the data input 94 of the first flipflop 90 so that the concatenation of the four flipflops 90 to 93 operates as a cyclic shift register and, moreover, incorrect switching states of the flipflops 90 to 93 are corrected. At the beginning of each counting cycle the logic circuit 115 applies, via its output 116 and the OR-gate 131, a new pulse to the concatenation of the flipflops 90 to 93, which pulse travels through the concatenation in response to the subsequent periods of the clock signal. Because the new pulse is applied to the data input 94 of the first flipflop 90, the initial state of the subsidiary counter circuit is assumed. This initial state can also be assumed by way of an externally applied reset signal, via the reset input 30 and the OR-gate 131, which reset signal also influences, via the inverter 141, the second to fourth flipflop 91 to 93 (if desired) so that this initial state is correctly assumed.

The control outputs 40, 41, 45 of the subsidiary counter circuit 1 are connected to a respective output collecting line 150, 151, 155 in the embodiment shown in FIG. 4. These output collecting lines 150, 151, 155 can be selectably connected, via connections 106, 107, 108 (bridges, for example in the wiring mask in the case of manufacture as an integrated circuit), to the terminals 123 to 126; in dependence on the relevant application, it may also be that only one or two of the output collecting lines 150, 151, 155 is connected to a respective one of the terminals 123 to 126. Preferably, the connections 102 to 108 are formed during the same manufacturing step.

The embodiment of a subsidiary counter circuit as shown in FIG. 4 can be inserted directly instead of the subsidiary counter circuits shown in the FIGS. 1 to 3, adaptation to the required number of control outputs 40 to 46 being readily obtained by appropriate connection of the output collecting lines 150, 151 or 155 provided in FIG. 4. Instead of the terminals 20, 30, 40, 41, 45 of the embodiment of the subsidiary counter circuit 1 of FIG. 4, the corresponding terminals of the second and the third subsidiary counter circuit 2 and 3, respectively, should then be designated and connected.

The teaching of the invention offers a counter and/or divider arrangement whose construction ensures uniform consumption of current from an associated power supply with very small peak currents. In the case of an application involving clock signals of high frequency, no so-called pipelining will be required. A counter device constructed in accordance with the invention enables extremely simple decoding of arbitrary counts. Notably the modular construction of the subsidiary counter circuits as a whole, but also the arrangement of the individual elements of the subsidiary counter circuits enables a "layout" consisting of cells which can be derived from a library for semiconductor manufacture. Thus, on the one hand subsidiary counter circuit modules with different total numbers of flipflops can be very simply composed from such a library of cells, but also finished subsidiary counter circuit modules can be readily adapted, using simply adaptable wiring masks, to different requirements, i.e. also to different total numbers of flipflops. This means that different numbers of flipflops can be provided for the subsidiary counter circuit module on a semiconductor body, so that as desired different total numbers of flipflops can be selected therefrom, by way of the wiring masks, for the benefit of the subsidiary counter circuit actually realised. The modulus of these subsidiary counter circuits is particularly simply adjusted by way of readily variable connections (bridges). All in all substantially reduced expenditure is thus achieved in forming a layout, implying a substantial saving in time during the design of electronic circuits. Moreover, the layout thus formed is simply and clearly structured. Circuits thus composed enable reliable operation, because notably no problems are incurred in respect of delay times. Moreover, a layout of this kind can be readily corrected and modified, and hence readily adapted to the relevant requirements. Complex arrangements, for example sequencers, can thus also have a clear layout. Notably for the design of sequencers a strong reduction is achieved in respect of logic circuits, so that surface area is saved on the semiconductor body and the current consumption of the circuit arrangement is reduced. Moreover, counter and/or divider arrangements in accordance with the invention can be constructed by means of all known manufacturing methods, for example as CMOS circuits, bipolar circuits, and the like.

What is claimed is:

1. A counter device for receiving a clock signal and outputting an output count signal at a counter output terminal comprising:

a first subsidiary counter circuit, said first counter circuit having an input for receiving said clock signal, at least one output and a reset terminal and including a plurality of flips-flops arranged in a serial arrangement, each flip-flop having a data input and a data output;

a second subsidiary counter circuit having an input for receiving said clock signal, at least one output and a reset terminal and including a plurality of flip-flops arranged in a serial arrangement; each flip-flop having a data input and a data output; and a logic element having a first input coupled to the data output of one of said flip-flops of said first subsidiary counter circuit, a second input coupled to an output of said second subsidiary counter circuit and an output coupled to said reset terminal of said first subsidiary counter circuit and said counter output terminal of said counter device;

wherein a product of a number of flip-flops of said first subsidiary counter circuit and a number of said flip-flops of said second subsidiary counter circuit is one of greater than and equal to one of a predetermined maximum count and division ratio, said number of flip-flops of said first subsidiary counter circuit and said number of flip-flops not having a common prime factor.

2. The counter device of claim 1, wherein said counter device includes a further counter output terminal further including a further logic element having a first input coupled to the data output of one of said flip-flops of said second subsidiary counter circuit, a second input coupled to an output of said first subsidiary counter circuit and an output coupled to said reset terminal of said second subsidiary counter circuit and said output counter terminal of said counter device.

3. A counter and/or divider arrangement as claimed in claim 2, characterized in that at least one of the subsidiary counter circuits comprises a logic circuit for forming a signal for influencing an input signal, applied to a first flipflop in the concatenation of flipflops of at least one of the subsidiary counter circuits in dependence on signals on given data outputs of the flipflops of the subsidiary counter circuit comprising the relevant logic circuit.

4. A counter and/or divider arrangement as claimed in claim 2, characterized in that the subsidiary counter circuits have a modular construction with corresponding concatenations of flipflops and corresponding logic circuits as well as for each subsidiary counter circuit a reset collecting line and at least one output collecting line, each output collecting line being selectably connectable to one of the data outputs of the flipflops in order to apply the signal on this data output to the associated logic element, and the reset collecting line being selectably connectable to reset inputs of one or more flip-flops and also being coupled to a data input of the first flipflop in the concatenation of flipflops, and additionally different, selected signals selectably applied to the logic circuit from the data outputs of the flipflops.

5. The counter device of claim 1, wherein said output of said logic element is coupled to said reset terminal of said second subsidiary counter circuit.

6. A counter and/or divider arrangement as claimed in claim 5 characterized in that it comprises at least one further logic element, a respective input of which is connected to the data output a respective flipflop of each subsidiary counter circuit, as well as a selection device (80) which receives all resultant signals and which applies one resultant signal therefrom as a common reset signal to all subsidiary counter circuits.

7. A counter and/or divider arrangement as claimed in claim 6, characterized in that the minimum number (k) of all flipflops required in the subsidiary counter circuits can be determined approximately from the (predetermined) maximum count or division ratio (n) in conformity with $$k=int(t\cdot(n)^{1/t})+1.$$

8. A counter and/or divider arrangement as claimed in claim 6, characterized in that the total numbers (li) of the flipflops of the subsidiary counter circuits can be determined approximately in conformity with the relation $$li=int((n/(l1\cdot l2\cdot\ldots\cdot lj))^{1/(t-j)}),$$

starting with $$l1=int((n)^{1/t}),$$

where $j=i-1$ t is the number of subsidiary counter circuits, and int denotes the function for rounding to the next-lower integer number, the values thus determined for the total numbers (li) being modified, if necessary, so that they do not have common prime factors, the product of all total numbers (li) of flipflops of the subsidiary counter circuits being larger than or equal to the maximum count or division ratio (n).

9. A counter and/or divider arrangement as claimed in claim 6, characterized in that the relation $$qi=((n-1)mod(li))+1 \text{ holds for each of the subsidiary counter circuits,}$$

where i denotes the subsidiary counter circuit, n denotes the maximum count or division ratio, li denotes the total number of flipflops of the $i^{th}$ subsidiary counter circuit, qi denotes the serial number of the flipflop in the concatenation of the $i^{th}$ subsidiary counter circuit whose data output is connected to the logic element, and mod denotes the modulo function.

10. A counter and/or divider arrangement as claimed in claim 5, characterized in that the relation $$qi=((n-1)mod(li))+1 \text{ holds for each of the subsidiary counter circuits,}$$

where i denotes the subsidiary counter circuit, n denotes the maximum count or division ratio, denotes the total number of flipflops of the $i^{th}$ subsidiary counter circuit, li denotes the total number of flipflops of the $i^{th}$ subsidiary counter circuit, qi denotes the serial number of the flipflop in the concatenation of the $i^{th}$ subsidiary counter circuit whose data output is connected to the logic element, and mod denotes the modulo function.

11. A counter and/or divider arrangement as claimed in claim 10, characterized in that the total numbers (li) of the flipflops of the subsidiary counter circuits can be determined approximately in conformity with the relation $$li=int(n/(l1\cdot l2\cdot\ldots\cdot lj))^{1/(t-j)}),$$

starting with $$l1=int((n)^{1/t}),$$

where $j=i-1$ t is the number of subsidiary counter circuits, and int denotes the function for rounding to the next-lower integer number, the values thus determined for the total numbers (li) being modified, if necessary, so that they do not have common prime factors, the product of all total numbers (li) of flipflops of the subsidiary counter circuits being larger than or equal to the maximum count or division ratio (n).

12. A counter and/or divider arrangement as claimed in claim 10, characterized in that the minimum number (k) of all flipflops required in the subsidiary counter circuits can be determined approximately from the (predetermined) maximum count or division ratio (n) in conformity with $$k = int(t \cdot (n)^{1/t}) + 1.$$

13. A counter and/or divider arrangement as claimed in claim 5, characterized in that the minimum number (k) of all flipflops required in th counter circuits can be determined approximately from the (predetermined) maximum count or division ratio (n) in conformity with $$k = int(t \cdot (n)^{1/t}) + 1.$$

14. A counter and/or divider arrangement as claimed in claim 5, characterized in that the total numbers (li) of the flipflops of the subsidiary counter circuits can be determined approximately in conformity with the relation $$li = int((n/(l1 \cdot l2 \cdot \ldots \cdot lj))^{1/(t-j)}),$$

starting with $$l1 = int(n)^{1/t}),$$

where j=i−1 t is the number of subsidiary counter circuits, and int denotes the function for rounding to the next- lower integer number, the values thus determined for the total numbers (li) being modified, if necessary, so that they do not have common prime factors, the product of all total numbers (li) of flipflops of the subsidiary counter circuits being larger than or equal to the maximum count or division ratio (n).

15. A counter and/or divider arrangement as claimed in claim 14, characterized in that the minimum number (k) of all flipflops required in the subsidiary counter circuits can be determined approximately from the (predetermined) maximum count or division ratio (n) in conformity with $$k = int(t \cdot (n)^{1/t}) + 1.$$

16. A counter and/or divider arrangement as claimed in claim 1, characterized in that at least one of the subsidiary counter circuits comprises a logic circuit for forming a signal for influencing an input signal, applied to a first flipflop in the concatenation of flipflops of at least one of the subsidiary counter circuits in dependence on signals on given data outputs of the flipflops of the subsidiary counter circuit comprising the relevant logic circuit.

17. A counter and/or divider arrangement as claimed in claim 1 characterized in that the subsidiary counter circuits have a modular construction with corresponding concatenations of flipflops and corresponding logic circuits as well as for each subsidiary counter circuit a reset collecting line and at least one output collecting line, each output collecting line being selectably connectable to one of the data outputs of the flipflops in order to apply the signal on this data output to the associated logic element, and the reset collecting line being selectably connectable to reset inputs of one or more flipflops and also being coupled to a data input of the first flipflop in the concatenation of flipflops, and additionally different, selected signals selectably applied to the logic circuit from the data outputs of the flipflops.

18. A sequencer, characterized in that it comprises a counter and/or divider arrangement as claimed in claim 1.

* * * * *